| | | | |
|---|---|---|---|
| 8,274,072 B2 | 9/2012 | Chen et al. | |
| 8,274,098 B2 | 9/2012 | Chung et al. | |
| 8,274,763 B2 | 9/2012 | Gurney et al. | |
| 8,276,211 B1 | 9/2012 | Freitas, Jr. et al. | |
| 2006/0102373 A1 | 5/2006 | Kamitake et al. | |
| 2012/0074430 A1 | 3/2012 | Lee et al. | |
| 2012/0122278 A1 | 5/2012 | Lee et al. | |
| 2012/0155029 A1 | 6/2012 | Wong et al. | |
| 2012/0206882 A1 | 8/2012 | Mohammed et al. | |
| 2013/0068521 A1 | 3/2013 | Hong et al. | |
| 2013/0277821 A1* | 10/2013 | Lundberg | 257/713 |
| 2014/0291819 A1* | 10/2014 | Barth | 257/659 |
| 2015/0004750 A1* | 1/2015 | Chi et al. | 438/108 |
| 2015/0008588 A1* | 1/2015 | Kim et al. | 257/774 |

FOREIGN PATENT DOCUMENTS

| | | |
|---|---|---|
| JP | 2009130113 | 6/2009 |
| JP | 2010253730 | 11/2010 |
| KR | 2011101081 | 9/2011 |
| KR | 2012059061 | 6/2012 |
| KR | 2012111585 | 10/2012 |

\* cited by examiner

*Primary Examiner* — William Coleman
(74) *Attorney, Agent, or Firm* — Onello & Mello, LLP

(57) ABSTRACT

A semiconductor package comprises a lower package comprising a lower substrate, a lower semiconductor chip on the lower substrate, a lower graphene layer on the lower semiconductor chip, and a lower molding layer between the lower substrate and the lower graphene layer. An upper package is on the lower substrate, the upper package spaced apart from the lower package, the upper package comprising an upper substrate, an upper semiconductor chip, and an upper molding layer. Lower conductive bumps are positioned between the lower substrate and the upper substrate, the lower bumps comprising a ground bump and a signal transmitting bump.

20 Claims, 11 Drawing Sheets

(12) United States Patent
Park

(10) Patent No.: US 9,070,677 B2
(45) Date of Patent: Jun. 30, 2015

(54) SEMICONDUCTOR PACKAGES INCLUDING GRAPHENE LAYERS

(71) Applicant: Samsung Electronics Co., Ltd., Suwon-si (KR)

(72) Inventor: Soojeoung Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/171,059

(22) Filed: Feb. 3, 2014

(65) Prior Publication Data

US 2014/0361428 A1  Dec. 11, 2014

(30) Foreign Application Priority Data

Jun. 5, 2013 (KR) .......... 10-2013-0064785

(51) Int. Cl.
 *H01L 23/498* (2006.01)
(52) U.S. Cl.
 CPC . H01L 23/49811 (2013.01); *H01L 2224/16225* (2013.01)
(58) Field of Classification Search
 CPC .............................. H01L 23/49811
 See application file for complete search history.

(56) References Cited

U.S. PATENT DOCUMENTS

| | | |
|---|---|---|
| 6,952,050 B2 | 10/2005 | Kwon et al. |
| 8,273,525 B2 | 9/2012 | Ryu et al. |

SEMICONDUCTOR PACKAGES INCLUDING GRAPHENE LAYERS

CROSS-REFERENCE TO RELATED APPLICATION

This U.S. non-provisional patent application claims priority under 35 U.S.C. §119 to Korean Patent Application No. 10-2013-0064785, filed on Jun. 5, 2013, in the Korean Intellectual Property Office, the disclosure of which is hereby incorporated by reference in its entirety.

BACKGROUND

The inventive concepts relate to semiconductor devices and, more particularly, to semiconductor device packages including a graphene layer.

There is continued development in the electronics industry toward light, small, high-speed and high-performance electronic devices. In some instances, there has been an effort to integrate a plurality of semiconductor chips or semiconductor packages into the same semiconductor package. Research continues toward an improvement in reliability and reduced size in semiconductor packages.

SUMMARY

Embodiments of the inventive concepts provide reliable semiconductor packages capable of improving heat exhaust, or heat removal, of a semiconductor chip, and methods of formation thereof.

Embodiments of the inventive concepts also provide semiconductor packages with improved electrical characteristics suitable for reducing electromagnetic interference (EMI) of a semiconductor chip, and methods of formation thereof.

In one aspect, a semiconductor package comprises: a lower package comprising a lower substrate, a lower semiconductor chip on the lower substrate, a lower graphene layer on the lower semiconductor chip, and a lower molding layer between the lower substrate and the lower graphene layer; an upper package on the lower substrate, the upper package spaced apart from the lower package, the upper package comprising an upper substrate, an upper semiconductor chip, and an upper molding layer; and lower conductive bumps between the lower substrate and the upper substrate, the lower bumps comprising a ground bump and a signal transmitting bump.

In some embodiments, the semiconductor package further comprises a first opening and a second opening in the lower molding layer and the lower graphene layer; wherein the first opening exposes an upper portion of the ground bump; and wherein the second opening exposes an upper portion of the signal transmitting bump.

In some embodiments, the semiconductor package further comprises a connection member in the first opening, the connection member electrically connecting the ground bump to the lower graphene layer.

In some embodiments, the semiconductor package further comprises an upper graphene layer on the upper semiconductor chip.

In some embodiments, the upper graphene layer is electrically connected to the ground bump and is electrically separated from the signal transmitting bump.

In some embodiments, the upper package further comprises upper conductive bumps surrounding the upper semiconductor chip on the upper substrate, wherein the upper bumps are in contact with the upper graphene layer.

In some embodiments, the upper graphene layer is electrically connected to the lower graphene layer.

In some embodiments, the upper molding layer includes a bottom surface facing the upper substrate, a top surface opposite the bottom surface, and a sidewall between the top surface and the bottom surface; wherein the upper package further comprises an upper side graphene layer at the sidewall of the upper molding layer.

In some embodiments, the lower package further comprises a lower coating layer on the lower graphene layer.

In some embodiments, the lower package further comprises: a lower side graphene layer and a lower side coating layer on the lower side graphene layer; wherein the lower molding layer includes a top surface, a bottom surface opposite the top surface, and a sidewall between an edge of the top surface and an edge of the bottom surface; and wherein the lower side graphene layer is on the sidewall of the lower molding layer.

In some embodiments, the semiconductor package further comprises an air gap between the lower graphene layer and the upper substrate.

In some embodiments, the graphene layer is in direct contact with the lower semiconductor chip.

In another aspect, a semiconductor package comprises: a substrate; a semiconductor chip on the substrate; conductive bumps laterally surrounding the semiconductor chip on the substrate; a graphene layer on the semiconductor chip; and a molding layer between the substrate and the graphene layer, wherein the graphene layer is electrically connected to the bumps.

In some embodiments, the semiconductor package further comprises a coating layer covering the graphene layer.

In some embodiments, the semiconductor package further comprises a side graphene layer covering a sidewall of the molding layer.

In another aspect, a semiconductor package comprises: a substrate; a semiconductor chip on the substrate and electrically connected to the substrate; a molding layer on the substrate and at a side of the semiconductor chip; a graphene layer directly on the semiconductor chip and on the molding layer opposite the substrate; and conductive bumps on the substrate and through the molding layer, the conductive bumps in contact with the substrate and the graphene layer to electrically connect the substrate and the graphene layer, the molding layer positioned between the conductive bumps and the semiconductor chip.

In some embodiments, the graphene layer is further at sidewalls of the molding layer.

In some embodiments, the conductive bumps comprise ground signal bumps.

In some embodiments, the semiconductor package further comprises conductive signal bumps on the substrate and through the molding layer, the conductive bumps in contact with the substrate and isolated from the graphene layer.

In some embodiments, the semiconductor package further comprises a coating layer on the graphene layer.

BRIEF DESCRIPTION OF THE DRAWINGS

The inventive concepts will become more apparent in view of the attached drawings and accompanying detailed description, in which.

DETAILED DESCRIPTION OF EMBODIMENTS

Figure 1:
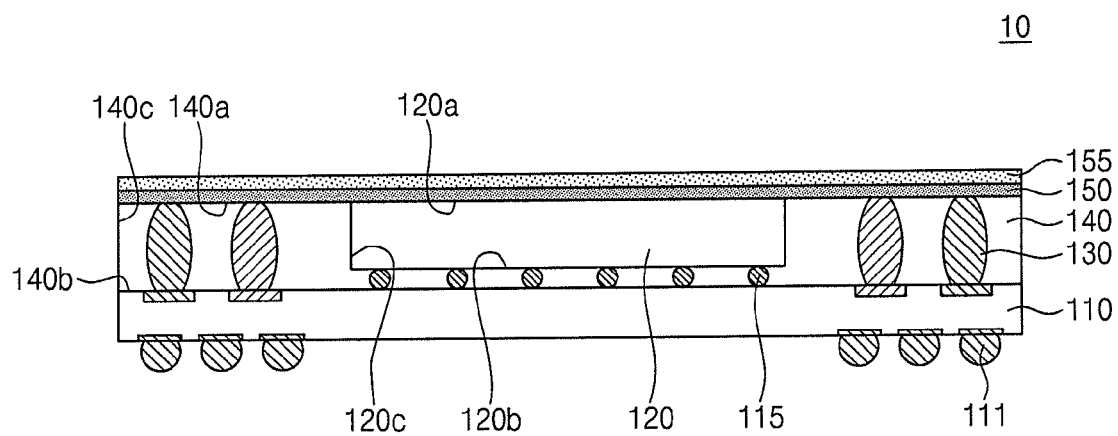
FIG. 1 is a cross-sectional view illustrating a semiconductor device according to some embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and to present such concepts to those skilled in the art. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Hereinafter, semiconductor devices according to the inventive concepts will be described.

FIG. 1 is a cross-sectional view illustrating a semiconductor device 10 according to some embodiments of the inventive concepts.

Referring to FIG. 1, the semiconductor device 10 may include a substrate 110, a semiconductor chip 120, bumps 130, a molding layer 140, a graphene layer 150, and a coating layer 155. In some embodiments, the semiconductor device 10 may be a semiconductor package.

In some embodiments, the substrate 110 may comprise a printed circuit board (PCB) having a circuit pattern. Connection terminals 111 may be disposed on a bottom surface of the substrate 110. The connection terminals 111 may include a conductive material. In some embodiments, the connection terminals 111 may have solder ball-shapes. In some embodiments, the connection terminals 111 may electrically connect the semiconductor chip 120 to an external device.

The semiconductor chip 120 may be mounted on the substrate 110, for example, using a flip chip bonding technique. In some embodiments, the semiconductor chip 120 may be disposed on a core of the substrate 110. The semiconductor chip 120 may have a top surface 120a, a bottom surface 120b opposite the top surface 120a, and a sidewall surface 120c connected between an edge of the top surface 120a and an edge of the bottom surface 120b. The top surface 120a may be in contact with the graphene layer 150. Interconnecting terminals 115 may be disposed between the substrate 110 and the semiconductor chip 120 to electrically connect the semiconductor chip 120 to the substrate 110. In some embodiments, the interconnecting terminals 115 may include a conductive material and may have solder ball-shapes or bump-shapes. In other embodiments, the semiconductor chip 120 may be connected to the substrate 110 through bonding wires. The semiconductor chip 120 may comprise an integrated circuit. For example, the semiconductor chip 120 may comprise a memory circuit, a logic circuit, or any combination thereof.

Bumps 130 may be disposed on the substrate 110 to laterally surround the semiconductor chip 120. The bumps 130 may operate to connect the graphene layer 150 to the substrate 110. In some embodiments, the bumps 130 may include a conductive material (e.g., a metal). In other embodiments, the bumps 130 may be omitted.

The molding layer 140 may be provided between the substrate 110 and the graphene layer 150 to fill a space between the bumps 130 and a space between the interconnecting terminals 115. The molding layer 140 may seal the sidewall 120c of the semiconductor chip 120. The molding layer 140 may include a top surface 140a, a bottom surface 140b opposite the top surface 140a, and a sidewall 140c connected between an edge of the top surface 140a and an edge of the bottom surface 140b. The top surface 140a of the molding layer 140 may have the same level as the top surface 120a of the semiconductor chip 120 to expose the top surface 120a of the semiconductor chip 120. In other embodiments, the molding layer 140 may extend between the semiconductor chip 120 and the graphene layer 150 to cover the top surface 120a of the semiconductor chip 120.

In some embodiments, the graphene layer 150 may cover the top surface 120a of the semiconductor chip 120 and the top surface 140a of the molding layer 140. The graphene layer 150 may be in contact with the bumps 130. Formation of the graphene layer 150 may include the preparation of a supporting film (not shown) on which the graphene layer 150 is formed, and transfer of the graphene layer 150 onto the semiconductor chip 120. In some embodiments, a formation process of the molding layer 140 may include a transfer process of the graphene layer 150, so that the graphene layer 150 may be readily formed on the semiconductor chip 120. For example, the graphene layer 150 and the supporting film (not shown) may be disposed on the semiconductor chip 120, with the graphene layer 150 facing the semiconductor chip 120. A space between the substrate 110 and the graphene layer 150 may be filled with an insulating polymer material such as an epoxy molding compound, thereby forming the molding layer 140 between the substrate 110 and the graphene layer 150. In some embodiments, the graphene layer 150 may be transferred onto the top surface 120a of the semiconductor chip 120 and/or the top surface 140a of the molding layer 140. Alternatively, in other embodiments, after the molding layer 140 is formed, the graphene layer 150 may be disposed and transferred onto the top surface 120a of the semiconductor chip 120 and/or the top surface 140a of the molding layer 140.

In some embodiments, the heat conductivity of the graphene layer 150 may be higher than a heat conductivity of the molding layer 140. Heat generated from the semiconductor chip 120 may be exhausted through the graphene layer 150 to regions external to the semiconductor device. In this manner, reliability of the semiconductor chip 120 may be improved. In some embodiments, graphene comprises a sheet or lattice of one of more layers of carbon atoms. In some embodiments, the thickness of the graphene layer 150 may be in the range of about 5 nm to about 10 μm. As a result, the semiconductor device 10 including the thin graphene layer 150 may have an overall thickness that is less than a conventional semiconductor device including a heat transmitting layer (e.g., 100 μm) and a heat slug (e.g., 300 μm). Additionally, semiconductor devices 10 in accordance with the present inventive concepts may readily exhaust heat generated from the semiconductor chip 120 through the graphene layer 150.

In some embodiments, the graphene layer 150 may have an electrical conductivity. As such, the graphene layer 150 may operate to further absorb an electric field and/or a magnetic field generated within the semiconductor device 10 in order to shield electromagnetic interference (EMI). The graphene layer 150 may be connected to the bumps 130 such that the EMI shielding effect of the graphene layer 150 may be further increased.

In some embodiments, the coating layer 155 may be positioned to cover the graphene layer 150, so that the graphene layer 150 may be stably adhered to the semiconductor chip 120 and/or the molding layer 140. In some embodiments, the coating layer 155 may include at least one of polyimide (PI), polyethylene terephthalate (PET), polyether ether ketone (PEEK), and an epoxy-based polymer. In this case, the coating layer 155 may comprise a supporting film used in the process of forming the graphene layer 150. For example, after the graphene layer 150 is transferred, a removal process of the supporting film may be omitted and the supporting film may be used as the coating layer 155. In other embodiments, the supporting film may be removed to expose the graphene layer 150. A curable polymer (e.g., a thermosetting polymer or a photo-curable polymer such as an UV-curable polymer) may be spray-coated on the graphene layer 150 to form the coating layer 155. In still other embodiments, the coating layer 155 may be omitted.

Figure 2:
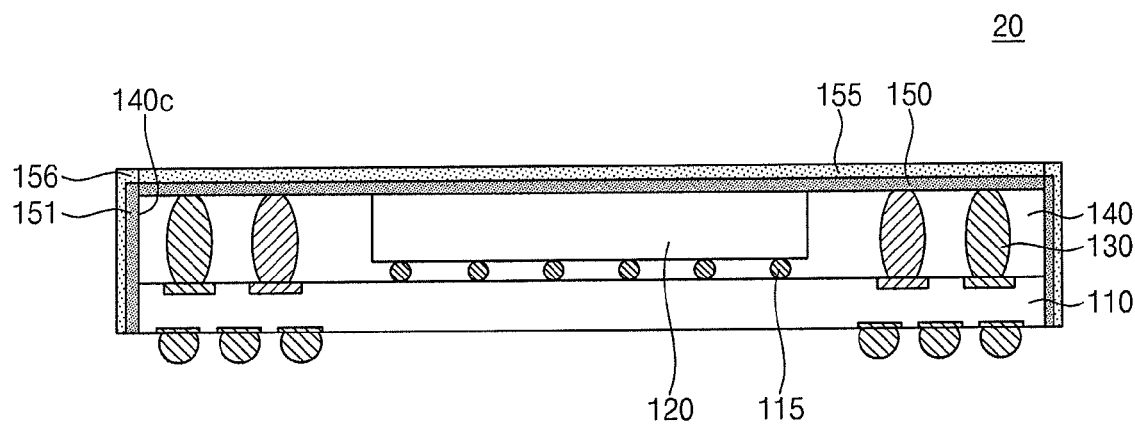
FIG. 2 is a cross-sectional view illustrating a semiconductor device according to other embodiments of the inventive concepts.

FIG. 2 is a cross-sectional view illustrating a semiconductor device according to other embodiments of the inventive concepts. Hereinafter, any descriptions already described in connection with other embodiments will be omitted or mentioned briefly.

Referring to FIG. 2, a semiconductor device 20 may include a substrate 110, a semiconductor chip 120, bumps 130, a molding layer 140, a graphene layer 150, and a coating layer 155. The semiconductor device 20 may be a semiconductor package. The substrate 110, the semiconductor chip 120, the bumps 130, the molding layer 140, the graphene layer 150, and the coating layer 155 may be the same as/similar to those described with reference to FIG. 1.

A side graphene layer 151 may be positioned to cover the sidewall 140c of the molding layer 140. In other embodiments, the side graphene layer 151 may extend along the sidewall 140c of the molding layer 140 to be further in contact with the substrate 110. A formation process of the side graphene layer 151 may be performed after the formation of the molding layer 140. A side coating layer 156 may be provided on the side graphene layer 151. In some embodiments, the side coating layer 156 may comprise a supporting film used in the formation process of the side graphene layer 151. In other embodiments, the side coating layer 156 may be formed by spray-coating a curable polymer. In this case, the coating layer 155 and the side coating layer 156 may be formed at the same time. In a semiconductor device 20 according to the present embodiments, heat exhaustion for the semiconductor chip 120 may be more improved and electromagnetic interference (EMI) may be further contained as a result of the presence of the side graphene layer 151.

Figure 3:
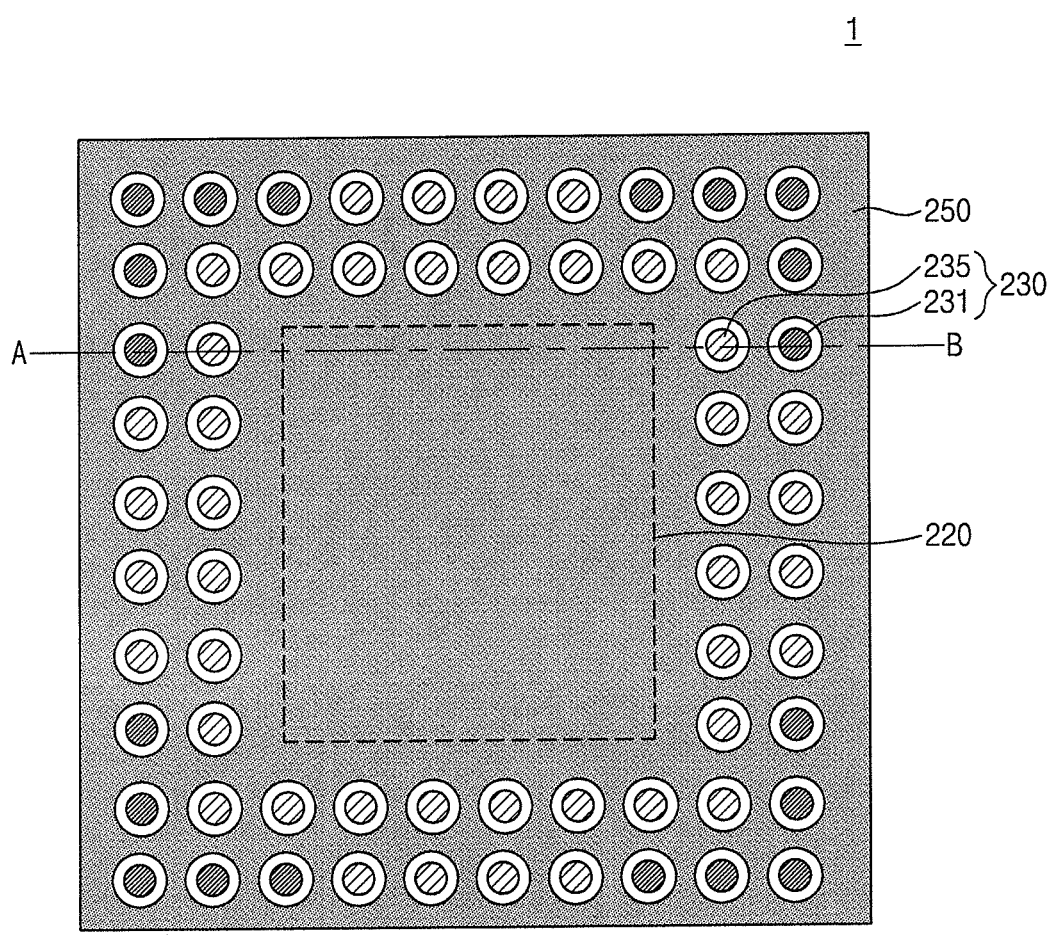
FIG. 3 is a plan view illustrating a semiconductor package according to some embodiments of the inventive concepts.
Figure 4:
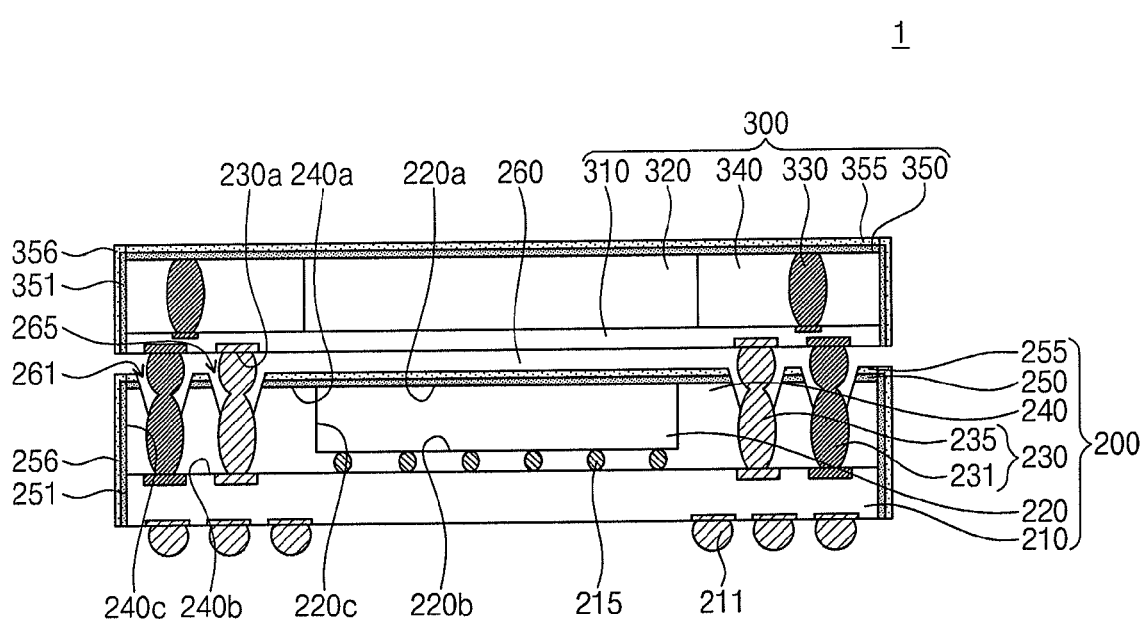
FIG. 4 is a cross-sectional view taken along a line A-B of FIG. 3.

FIG. 3 is a plan view illustrating a semiconductor package according to some embodiments of the inventive concepts. FIG. 4 is a cross-sectional view taken along a line A-B of FIG. 3. Hereinafter, any descriptions already described in connection with other embodiments will be omitted or mentioned briefly.

Referring to FIGS. 3 and 4, a semiconductor package 1 may be configured as a package-on-package (PoP) device including a lower package 200 and an upper package 300. An air gap 260 may be provided between the lower package 200 and the upper package 300.

The lower package 200 may include a lower substrate 210, a lower semiconductor chip 220, lower bumps 230, a lower molding layer 240, a lower graphene layer 250, and a lower coating layer 255. The lower substrate 210 may comprise a printed circuit board (PCB) having a circuit pattern. Connection terminals 211 may be disposed on a bottom surface of the lower substrate 210. The connection terminals 211 may electrically connect the lower semiconductor chip 220 and/or an upper semiconductor chip 320 to an external device.

The lower semiconductor chip 220 may be mounted on a surface of the lower substrate 210 in a face down orientation. Interconnecting terminals 215 may be disposed between the lower substrate 210 and the lower semiconductor chip 220 to electrically connect the lower semiconductor chip 220 to the lower substrate 210. The interconnecting terminals 215 may include a conductive material. In some embodiments, the interconnecting terminals 215 may have solder ball-shapes or bump-shapes. A top surface 220a of the lower semiconductor chip 220 may comprise a non-active surface, and a bottom surface 220b of the lower semiconductor chip 220 may comprise an active surface. In various embodiments, the lower semiconductor chip 220 may include an integrated circuit (e.g., a memory circuit, a logic circuit, or any combination thereof).

Lower bumps 230 may be provided on the one surface of the lower substrate 210 to laterally surround the lower semiconductor chip 220, for example surround with respect to a plan view. The lower bumps 230 may operate to electrically connect the upper package 300 to the lower substrate 210 and/or the lower semiconductor chip 220. In some embodiments, a topmost surface 230a of the lower bump 230 may be disposed at a level higher than the top surface 220a of the lower semiconductor chip 220. In some embodiments, the lower bumps 230 may include a conductive material (e.g., a metal). The lower bumps 230 may include at least one ground bump 231 and at least one signal transmitting bump 235. In some embodiments, the ground bump 231 may be disposed at outer corners or outer side regions of the lower substrate 210.

The lower molding layer 240 may be positioned between the lower substrate 210 and the lower graphene layer 250. The lower molding layer 240 may fill a space between the lower bumps 230 and a space between the interconnecting terminals 215 on the lower substrate 210. The lower molding layer 240 may seal a sidewall 220c of the lower semiconductor chip 220. The lower molding layer 240 may include a top surface 240a, a bottom surface 240b opposite to the top surface 240a, and a sidewall 240c connected between an edge of the top surface 240a and an edge of the bottom surface 240b. The top surface 240a of the lower molding layer 240 may be positioned at substantially the same level as the top surface 220a of the lower semiconductor chip 220, so that the top surface 220a of the lower semiconductor chip 220 may make direct contact with the lower graphene layer 250. In other embodiments, the lower molding layer 240 may extend between the lower semiconductor chip 220 and the lower graphene layer 250, so as to cover the lower semiconductor chip 220.

The lower graphene layer 250 may be provided on the lower semiconductor chip 220 and the lower molding layer 240. In some embodiments, the lower graphene layer 250 may be in contact with the lower semiconductor chip 220. The lower graphene layer 250 has properties that allow for the transport of or exhaustion of heat generated from the lower semiconductor chip 220 to the air gap 260. The lower coating layer 255 may cover the lower graphene layer 250. The lower coating layer 255 may, in some embodiments, be the same as or similar to the coating layer 155 described with reference to FIG. 1. In other embodiments, the lower package 200 may further include a lower side graphene layer 251 provided on the sidewall 240c of the lower molding layer 240 and/or a lower side coating layer 256 covering the lower side graphene layer 251.

At least one first opening 261 and at least one second opening 265 may be formed or positioned in the lower molding layer 240, the lower graphene layer 250 and the lower coating layer 255. In some embodiments, the first opening 261 may expose an upper portion of the ground bump 231. In some embodiments, the second opening 265 may expose an upper portion of the signal transmitting bump 235. The lower graphene layer 250 may be spaced apart from the ground bump 231 and the signal transmitting bump 235. In this manner, an electrical short between the ground bump 231 and the signal transmitting bump 235 may be prevented.

The air gap 260 may be provided between the lower graphene layer 250 and an upper substrate 310. The heat generated from the lower semiconductor chip 220 may be exhausted through the air gap 260 to regions external to semiconductor package 1. In other embodiments, the air gap 260 may be omitted, and portions of the lower graphene layer 250 may be in direct contact with portions of the upper substrate 310.

In some embodiments, the upper package 300 may include the upper substrate 310, the upper semiconductor chip 320, upper bumps 330, an upper molding layer 340, an upper graphene layer 350, and an upper coating layer 355. The upper substrate 310, the upper semiconductor chip 320, the upper bumps 330, the upper molding layer 340, the upper graphene layer 350, and the upper coating layer 355 may, in some embodiments, be respectively the same as or similar to the substrate 110, the semiconductor chip 120, the bumps 130, the molding layer 140, the graphene layer 150, and the coating layer 155 that are described herein with reference to FIG. 1. The upper package 300 may further include an upper side graphene layer 351 provided on a sidewall of the upper molding layer 340 and/or an upper side coating layer 356 covering the upper side graphene layer 351. In other embodiments, the upper bumps 330 may be omitted. In still other embodiments, one of the lower graphene layer 250 or the upper graphene layer 350 may be omitted.

Figure 5:
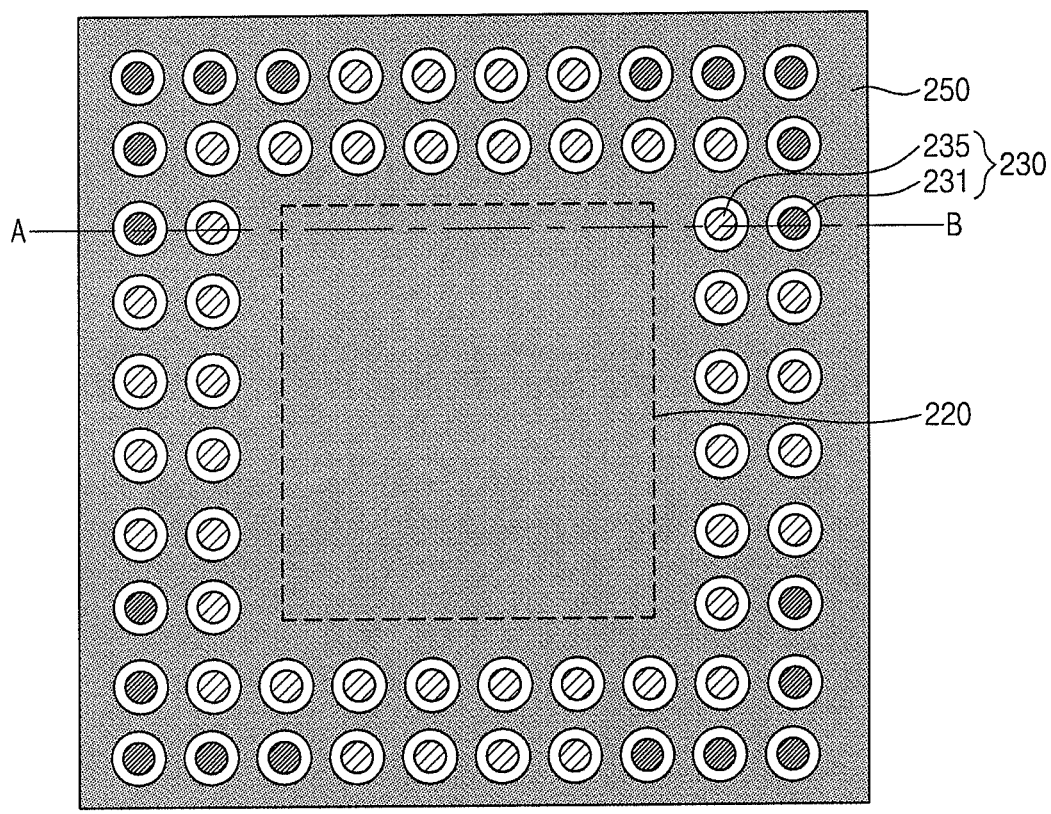
FIG. 5 is a plan view illustrating a semiconductor package according to other embodiments of the inventive concepts.
Figure 6:
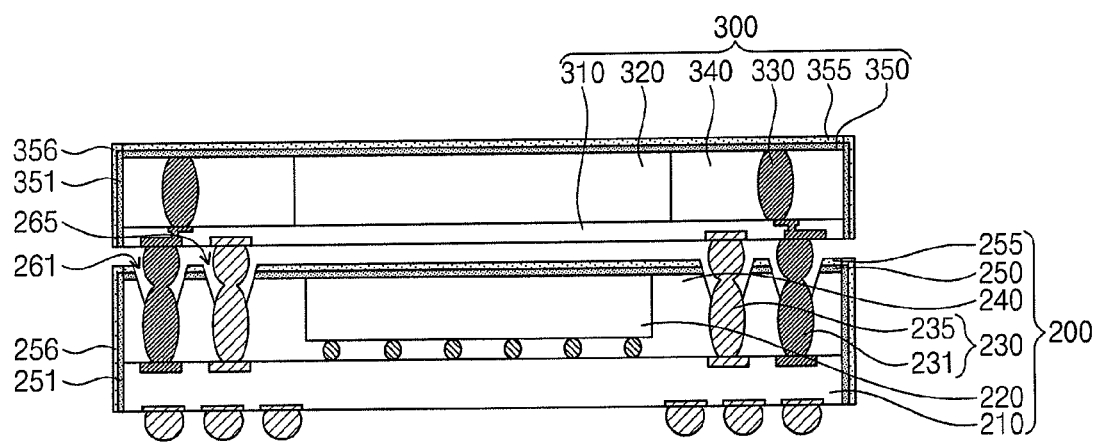
FIG. 6 is a cross-sectional view taken along a line A-B of FIG. 5.

FIG. 5 is a plan view illustrating a semiconductor package according to other embodiments of the inventive concepts. FIG. 6 is a cross-sectional view taken along a line A-B of FIG. 5. Hereinafter, any descriptions already described in connection with other embodiments will be omitted or mentioned briefly.

Referring to FIGS. 5 and 6, a semiconductor package 2 may be a package-on-package (PoP) device including a lower package 200 and an upper package 300. An air gap 260 may be provided between the lower package 200 and the upper package 300.

The lower package 200 may include a lower substrate 210, a lower semiconductor chip 220, lower bumps 230, a lower molding layer 240, a lower graphene layer 250, and a lower coating layer 255. The lower package 200 may further include a lower side graphene layer 251 and/or a lower side coating layer 256. A first opening 261 and a second opening 265 may be provided in the lower molding layer 250. The lower package 200 may be the same as or similar to that of FIGS. 3 and 4.

In the present embodiment, the upper package 300 may include an upper substrate 310, an upper semiconductor chip 320, upper bumps 330, an upper molding layer 340, an upper graphene layer 350, and an upper coating layer 355. The upper package 300 may further include an upper side graphene layer 351 and/or an upper side coating layer 356 that are provided on a sidewall of the upper molding layer 340. The upper package 300 may be the same as or similar to that of FIGS. 3 and 4.

The upper graphene layer 350 may be electrically connected to the ground bump 231 through the upper bumps 330. In this case, the upper graphene layer 350 is not connected to the signal transmitting bump 235. Since the upper graphene layer 350 is electrically connected to the ground bump 231 in the semiconductor package 1 according to the present embodiment, electromagnetic interference (EMI) may be further reduced. As the number of the ground bumps 231 electrically connected to the upper graphene layer 350 is increased, the electrical characteristics (e.g., reduction of the EMI) of the semiconductor package 2 may be further improved.

Figure 7:
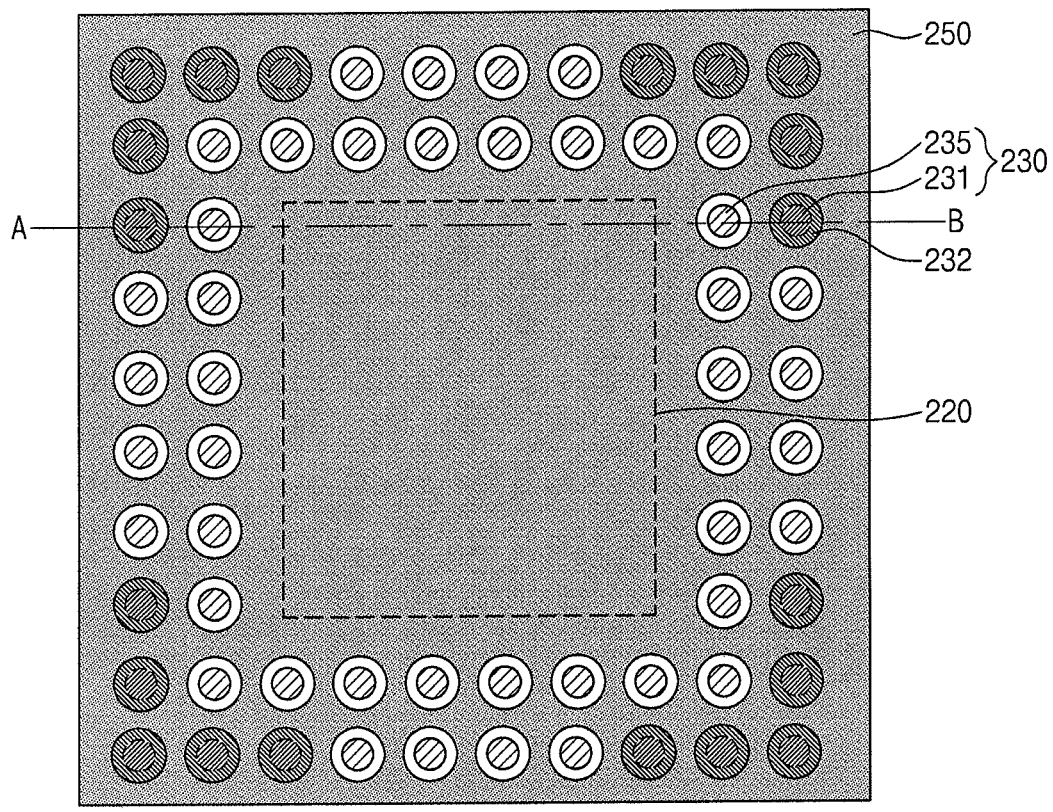
FIG. 7 is a plan view illustrating a semiconductor package according to other embodiments of the inventive concepts.
Figure 8:
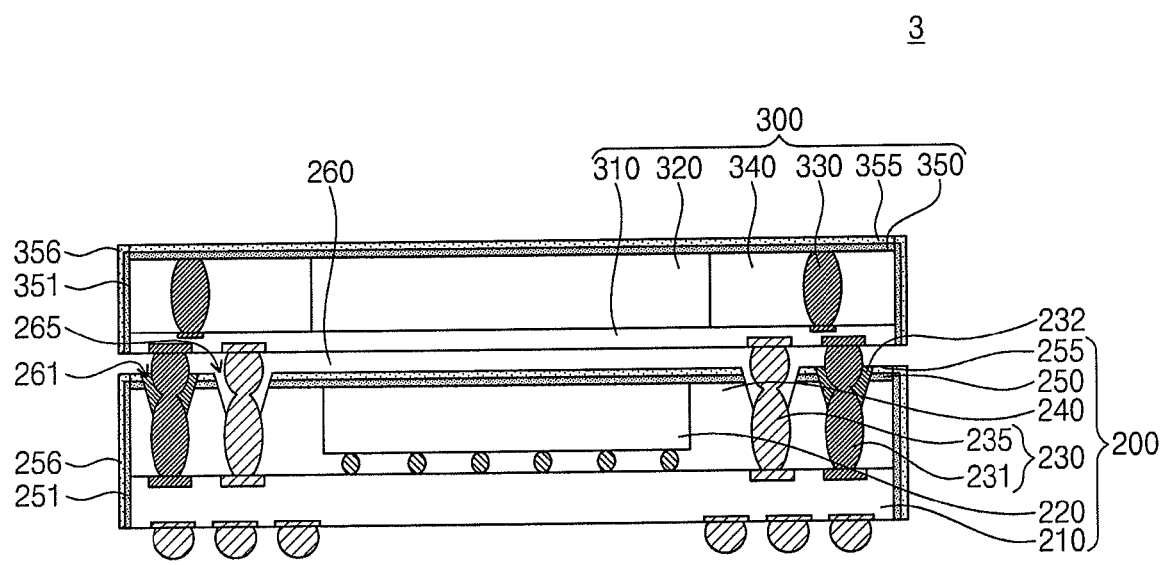
FIG. 8 is a cross-sectional view taken along a line A-B of FIG. 7.

FIG. 7 is a plan view illustrating a semiconductor package according to other embodiments of the inventive concepts. FIG. 8 is a cross-sectional view taken along a line A-B of FIG. 7. Hereinafter, any descriptions already described in connection with other embodiments will be omitted or mentioned briefly.

Referring to FIGS. 7 and 8, a semiconductor package 3 may include a lower package 200 and an upper package 300. An air gap 260 may be provided between the lower package 200 and the upper package 300.

In this embodiment, the lower package 200 may include the lower substrate 210, the lower semiconductor chip 220, the lower bumps 230, the lower molding layer 240, the lower graphene layer 250, and the lower coating layer 255. A connection member 232 may be provided in the first opening 261 to electrically connect the lower graphene layer 250 to the ground bump 231. The connection member 232 may include a conductive material. In the semiconductor package 3 of the present embodiment, the heat exhaust and the EMI of the lower semiconductor chip 220 may be further improved as a result of the presence of the connection member 232. As the number of the ground bumps 231 connected to the lower graphene layer 250 is increased, the EMI of the lower semiconductor chip 220 may be further reduced.

It should be noted that a connection member 232 is not provided in the second opening 265. As a result, the lower graphene layer 250 is physically and/or electrically separated from the signal transmitting bump 235 to prevent shorting of the signals on the signal transmitting bump 235. In other embodiments, the lower package 200 may further include the lower side graphene layer 251 and/or a lower side coating layer 256.

The upper package 300 may include the upper substrate 310, the upper semiconductor chip 320, the upper bumps 330, the upper molding layer 340, the upper graphene layer 350, and the upper coating layer 355. The upper package 300 may further include the upper side graphene layer 351 and/or the upper side coating layer 356. In other embodiments, the upper bumps 330 may be omitted. In still other embodiments, the upper bumps 330 and the upper graphene layer 350 may be omitted.

Figure 9:
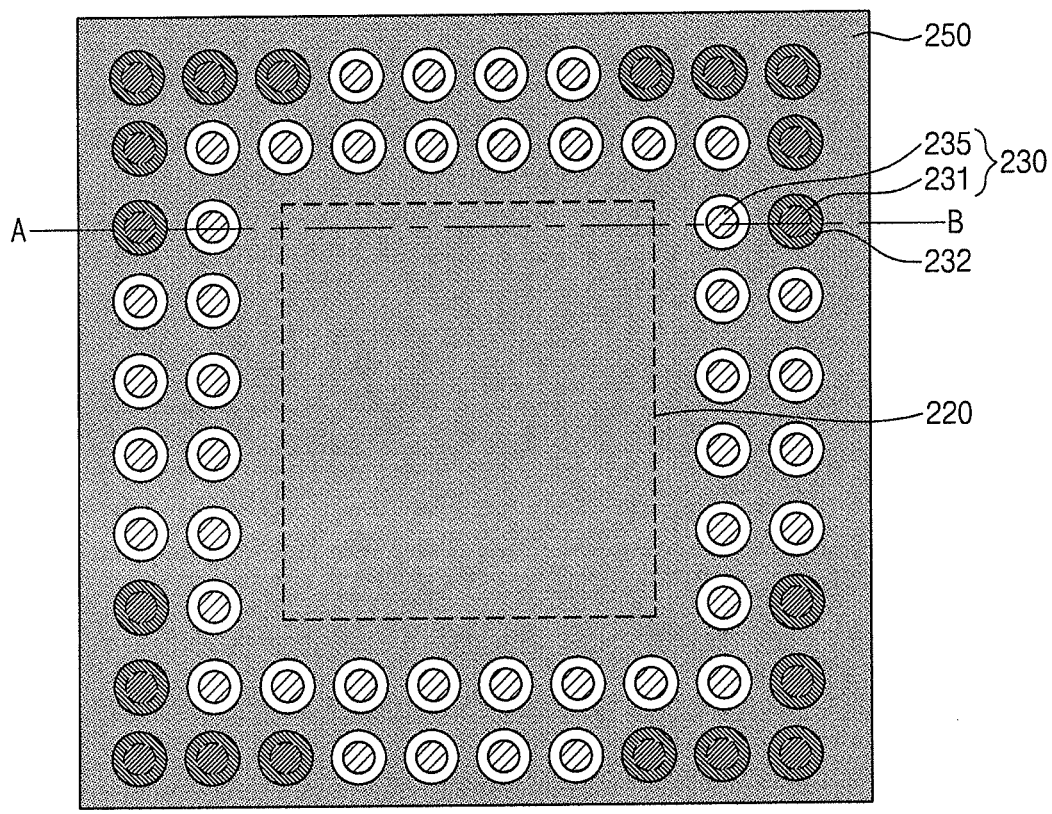
FIG. 9 is a plan view illustrating a semiconductor package according to other embodiments of the inventive concepts.
Figure 10:
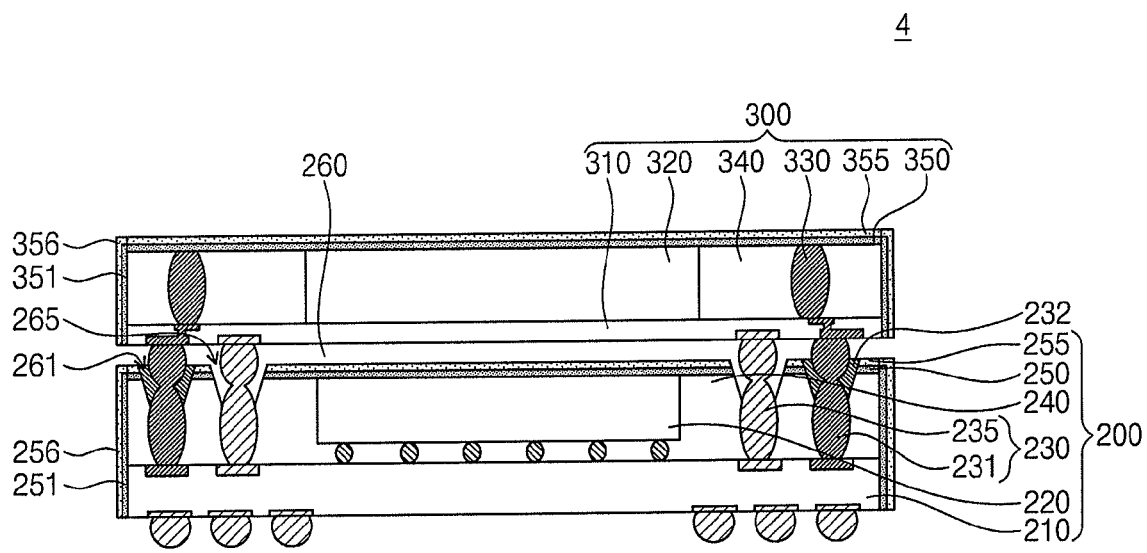
FIG. 10 is a cross-sectional view taken along a line A-B of FIG. 9.

FIG. 9 is a plan view illustrating a semiconductor package according to other embodiments of the inventive concepts. FIG. 10 is a cross-sectional view taken along a line A-B of FIG. 9. Hereinafter, any descriptions already described in connection with other embodiments will be omitted or mentioned briefly.

Referring to FIGS. 9 and 10, a semiconductor package 4 may include a lower package 200 and an upper package 300. An air gap 260 may be provided between the lower package 200 and the upper package 300.

The lower package 200 may include the lower substrate 210, the lower semiconductor chip 220, the lower bumps 230, the lower molding layer 240, the lower graphene layer 250, and the lower coating layer 255. The connection member 232 may be provided in the first opening 261 to electrically connect the lower graphene layer 250 to the ground bump 231. The connection member 232 is not provided in the second opening 265, such that the lower graphene layer 250 is physically and/or electrically separated from the signal transmitting bump 235. In other embodiments, the lower package 200 may further include the lower side graphene layer 251 and/or a lower side coating layer 256.

The upper package 300 may include the upper substrate 310, the upper semiconductor chip 320, the upper bumps 330, the upper molding layer 340, the upper graphene layer 350, and the upper coating layer 355. The upper package 300 may further include the upper side graphene layer 351 and/or the upper side coating layer 356. The upper graphene layer 350 may be electrically connected to the ground bump 231 and the lower graphene layer 250 through the upper bump 330. Since the upper graphene layer 350 is electrically connected to the lower graphene layer 250 in the semiconductor package 4 of the present embodiment, the electrical characteristics of the semiconductor package 4 may be further improved. For example, EMI may be even further contained by shielding from the upper graphene layer 350 and the lower graphene layer 250.

Hereinafter, a method of manufacturing a semiconductor package according to embodiments of the inventive concepts will be described.

Figure 11:
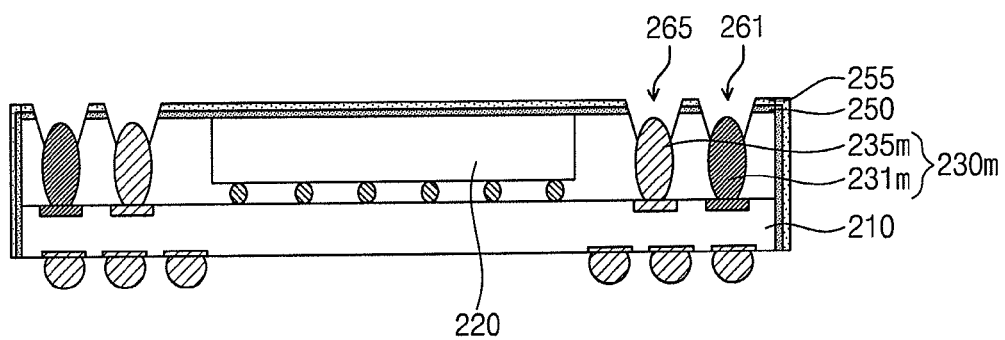
FIGS. 11 and 12 are cross-sectional views illustrating a method of manufacturing a semiconductor package according to embodiments of the inventive concepts.
Figure 12:
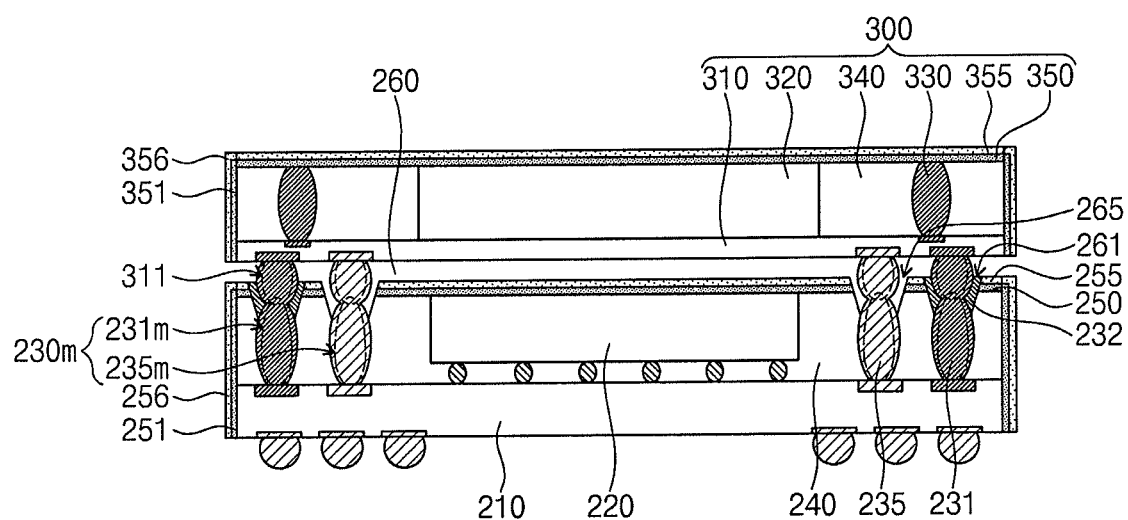

FIGS. 11 and 12 are cross-sectional views illustrating a method of manufacturing a semiconductor package according to example embodiments of the inventive concepts. Hereinafter, any descriptions already described in connection with other embodiments will be omitted or mentioned briefly.

Referring to FIG. 11, a lower substrate 210 may be provided. The lower substrate 210 may include a lower semiconductor chip 220, lower solders 230m, a lower molding layer 240, a lower graphene layer 250, and a lower coating layer 255. In some embodiments, the lower substrate 210, the lower semiconductor chip 220, the lower molding layer 240, the lower graphene layer 250, and the lower coating layer 255 may be respectively the same as or similar to the substrate 110, the semiconductor chip 120, the molding layer 140, the graphene layer 150, and the coating layer 155 that are described with reference to the other embodiments described herein. The lower solders 230m may be formed by the same method as or a similar method to the forming method of the bumps 130 in FIG. 1. At least one first opening 261 and at least one second opening 265 may be formed in the lower molding layer 240, the lower graphene layer 250 and the lower coating layer 255. The first opening 261 and the second opening 265 may, in some embodiments, expose a ground solder 231m and a signal transmitting solder 235m, respectively. The first and second openings 261 and 265 may be formed by a laser drilling process. In other embodiments, the process of forming the lower molding layer 240, the process of forming the lower solders 230m, and the process of forming the lower graphene layer 250 may be sequentially performed. In this case, the lower molding layer 240 may be patterned to expose the lower substrate 210, and then the lower solders 230m may be formed on the exposed lower substrate 210. In other embodiments, after the lower solders 230m, the lower molding layer 240, the first opening 261 and the second opening 265 are formed, the lower graphene layer 250 and the lower coating layer 255 may be formed on the lower molding layer 240.

Referring to FIG. 12, a connection member 232 may be formed in the first opening 261, so that the ground solder 231m may be electrically connected to the lower graphene layer 250. In some embodiments, the connection member 232 is not formed in the second opening 265, so that the signal transmitting solder 235m is electrically isolated from the lower graphene layer 250. In some embodiments, the first opening 261 may be filled with a mixture of a conductive material (e.g., solder paste or silver (Ag)) and an epoxy polymer, thereby forming the connection member 232. Thereafter, an upper package 300 may be mounted on one surface of the lower substrate 210. The upper package 300 may be electrically connected to the lower semiconductor chip 220. The upper package 300 may be formed by the same method as or a similar method to the forming method of the semiconductor device 10 described with reference to FIG. 1. In some embodiments, connection terminals 311 may be provided on a bottom surface of an upper substrate 310 of the upper package 300. The upper substrate 310 may be disposed on the lower substrate 210. At this time, the connection terminals 311 may be disposed on the lower solders 230m, respectively. The lower solders 230m and the connection terminals 311 may be soldered with each other to form lower bumps 230. In this manner, the upper package 300 may be electrically connected to the lower substrate 210. In some embodiments, topmost surfaces of the lower bumps 230 may be disposed at a level higher than a top surface of the lower graphene layer 250, such that an air gap 260 may be provided between the lower graphene layer 250 and the upper substrate 310. In other embodiments, after the upper package 300 is mounted on the lower package 200, the connection member 232 may be formed in the first opening 261. In still other embodiments, the forming process of the connection member 232 may be omitted.

APPLICATIONS

Figure 13:
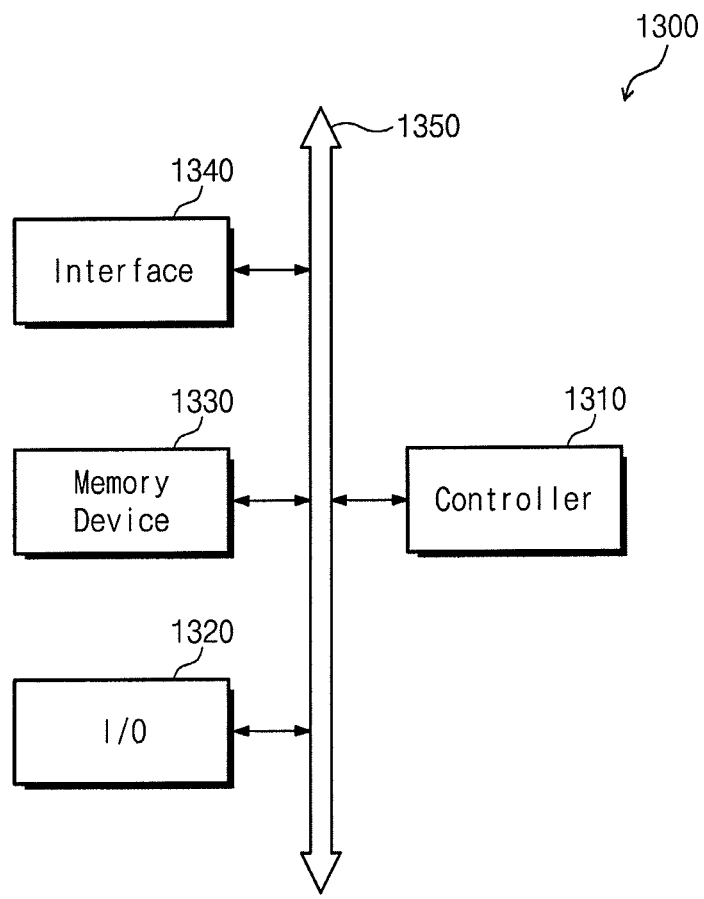
FIG. 13 is a schematic block diagram illustrating an example of electronic systems including semiconductor packages according to embodiments of the inventive concepts.
Figure 14:
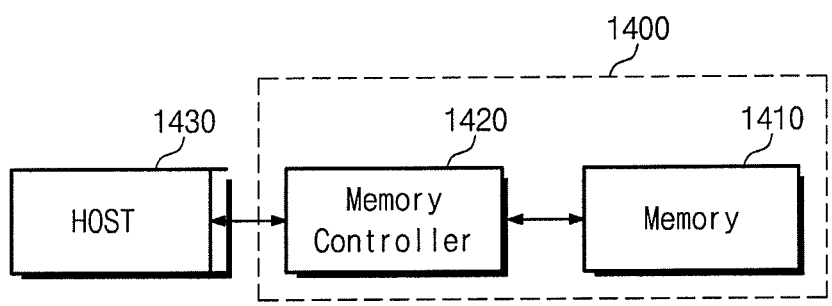
FIG. 14 is a schematic block diagram illustrating an example of memory systems including semiconductor packages according to embodiments of the inventive concepts.

FIG. 13 is a schematic block diagram illustrating an example of electronic systems including semiconductor packages according to embodiments of the inventive concepts. FIG. 14 is a schematic block diagram illustrating an example of memory systems including semiconductor packages according to embodiments of the inventive concepts.

Referring to FIG. 13, an electronic system 1300 may include a controller 1310, an input/output (I/O) unit 1320, and a memory device 1330. The controller 1310, the I/O unit 1320, and the memory device 1330 may communicate with each other through a data bus 1350. The data bus 1350 may correspond to a path through which electrical signals are transmitted. For example, the controller 1310 may include at least one of a microprocessor, a digital signal processor, a microcontroller or other logic devices having a similar function to any one thereof. The controller 1310 and the memory device 1330 may include at least one of the semiconductor packages 1 to 4 according to embodiments of the inventive concepts. The I/O unit 1320 may include a keypad, a keyboard and/or a display unit. The memory device 1330 may store data and/or commands executed by the controller 1310. The memory devices 1330 may include a volatile memory device and/or a non-volatile memory device. Alternatively, the memory devices 1330 may include a flash memory device. For example, a flash memory device applied with the technical features of the inventive concepts may be installed in an information processing system such as a mobile device or a desk top computer. The flash memory devices may constitute a solid state disk (SSD). In this case, the electronic system 1300 may stably store massive data in the flash memory system. The electronic system 1300 may further include an interface unit 1340 for transmitting data to a communication network or for receiving data from a communication network. The interface unit 1340 may operate by wireless or cable. For example, the interface unit 1340 may include an antenna for wireless communication or a transceiver for cable communication. Although not shown in the drawings, the electronic system 1300 may further include an application chipset and/or a camera image sensor (CIS).

The electronic system 1300 may be realized as a mobile system, a personal computer, an industrial computer, or a logic system performing various functions. For example, the mobile system may be one of a personal digital assistant (PDA), a portable computer, a web tablet, a mobile phone, a wireless phone, a laptop computer, a memory card, a digital music player, or an information transmitting/receiving system. In a case where the electronic system 1300 performs wireless communication, the electronic device 1300 may be used in a communication interface protocol such as a third generation communication system (e.g., CDMA, GSM, NADC, E-TDMA, WCDAM, and/or CDMA2000).

Referring to FIG. 14, a memory system 1400 may include a non-volatile memory device 1410 and a memory controller 1420. The non-volatile memory device 1410 and the memory controller 1420 may operate to store data or to retrieve stored data. In some embodiments, the non-volatile memory device 1410 may include at least one of the semiconductor packages 1 to 4 according to embodiments of the inventive concepts. The memory controller 1420 may control the non-volatile memory device 1410 in response to read/write requests of a host 1430, such that data stored in the non-volatile memory device 1410 may be sensed or data may be stored in the non-volatile memory device 1410.

A semiconductor package according to embodiments of the inventive concepts includes a graphene layer provided on the semiconductor chip. As a result, heat generated from the semiconductor chip may be readily exhausted through the graphene layer to regions external to the semiconductor package. Additionally, the graphene layer can further be configured and operable as an EMI shield suitable for absorbing electric fields and/or magnetic fields generated at the inside of the semiconductor package, so that EMI characteristics of the semiconductor package may be improved. In this manner, the reliability of the semiconductor package may be improved. Moreover, the formation process of the molding layer may, in some embodiments, include the transfer process of the graphene layer, such that the graphene layer may be readily formed on the semiconductor chip.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. A semiconductor package comprising:
   a lower package comprising a lower substrate, a lower semiconductor chip on the lower substrate, a lower graphene layer on the lower semiconductor chip, and a lower molding layer between the lower substrate and the lower graphene layer;
   an upper package on the lower substrate, the upper package spaced apart from the lower package, the upper package comprising an upper substrate, an upper semiconductor chip, and an upper molding layer; and
   lower conductive bumps between the lower substrate and the upper substrate, the lower conductive bumps comprising a ground bump and a signal transmitting bump.

2. The semiconductor package of claim 1, further comprising a first opening and a second opening in the lower molding layer and the lower graphene layer;
   wherein the first opening exposes an upper portion of the ground bump; and
   wherein the second opening exposes an upper portion of the signal transmitting bump.

3. The semiconductor package of claim 1, further comprising an upper graphene layer on the upper semiconductor chip.

4. The semiconductor package of claim 1, wherein the lower package further comprises a lower coating layer on the lower graphene layer.

5. The semiconductor package of claim 1, wherein the lower package further comprises: a lower side graphene layer and a lower side coating layer on the lower side graphene layer;
   wherein the lower molding layer includes a top surface, a bottom surface opposite the top surface, and a sidewall between an edge of the top surface and an edge of the bottom surface; and
   wherein the lower side graphene layer is on the sidewall of the lower molding layer.

6. The semiconductor package of claim 1, further comprising an air gap between the lower graphene layer and the upper substrate.

7. The semiconductor package of claim 1, wherein the lower graphene layer is in direct contact with the lower semiconductor chip.

8. The semiconductor package of claim 2, further comprising a connection member in the first opening, the connection member electrically connecting the ground bump to the lower graphene layer.

9. The semiconductor package of claim 3, wherein the upper graphene layer is electrically connected to the ground bump and is electrically separated from the signal transmitting bump.

10. The semiconductor package of claim 3, wherein the upper package further comprises upper conductive bumps surrounding the upper semiconductor chip on the upper substrate, wherein the upper conductive bumps are in contact with the upper graphene layer.

11. The semiconductor package of claim 3, wherein the upper graphene layer is electrically connected to the lower graphene layer.

12. The semiconductor package of claim 3, wherein the upper molding layer includes a bottom surface facing the upper substrate, a top surface opposite the bottom surface, and a sidewall between the top surface and the bottom surface; and
    wherein the upper package further comprises an upper side graphene layer at the sidewall of the upper molding layer.

13. A semiconductor package comprising:
    a substrate;
    a semiconductor chip on the substrate;
    conductive bumps laterally surrounding the semiconductor chip on the substrate;
    a graphene layer on the semiconductor chip; and
    a molding layer between the substrate and the graphene layer,
    wherein the graphene layer is electrically connected to the conductive bumps.

14. The semiconductor package of claim 13, further comprising a coating layer covering the graphene layer.

15. The semiconductor package of claim 13, further comprising a side graphene layer covering a sidewall of the molding layer.

16. A semiconductor package comprising:
    a substrate;
    a semiconductor chip on the substrate and electrically connected to the substrate;
    a molding layer on the substrate and at a side of the semiconductor chip;
    a graphene layer directly on the semiconductor chip and on the molding layer opposite the substrate; and
    conductive bumps on the substrate and through the molding layer, the conductive bumps in contact with the substrate and the graphene layer to electrically connect the substrate and the graphene layer, the molding layer positioned between the conductive bumps and the semiconductor chip.

17. The semiconductor package of claim 16, wherein the graphene layer is further at sidewalls of the molding layer.

18. The semiconductor package of claim 16, wherein the conductive bumps comprise ground signal bumps.

19. The semiconductor package of claim 16, further comprising conductive signal bumps on the substrate and through the molding layer, the conductive bumps in contact with the substrate and isolated from the graphene layer.

20. The semiconductor package of claim 16, further comprising a coating layer on the graphene layer.

* * * * *